(12) United States Patent
Park et al.

(10) Patent No.: US 7,208,947 B2
(45) Date of Patent: Apr. 24, 2007

(54) FLUXGATE SENSOR INTEGRATED IN A SEMICONDUCTOR SUBSTRATE AND METHOD FOR MANUFACTURING THE SAME

(75) Inventors: Hae-seok Park, Seoul (KR); Dong-sik Shim, Seoul (KR); Sang-on Choi, Suwon-si (KR); Kyung-won Na, Yong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 265 days.

(21) Appl. No.: 10/763,394

(22) Filed: Jan. 26, 2004

(65) Prior Publication Data

US 2005/0035761 A1     Feb. 17, 2005

(30) Foreign Application Priority Data

Jan. 25, 2003    (KR)    .................. 10-2003-0005078

(51) Int. Cl.
*G01R 33/04* (2006.01)
*G01R 33/02* (2006.01)

(52) U.S. Cl. ..................... 324/253; 324/249

(58) Field of Classification Search .............. 324/249, 324/253
See application file for complete search history.

(56) References Cited

U.S. PATENT DOCUMENTS 6,411,086 B1 * 6/2002 Choi et al. ................. 324/253
6,429,651 B1   8/2002 Choi et al.
6,690,164 B1 * 2/2004 Fedeli et al. ............... 324/253
2004/0027121 A1 * 2/2004 Choi et al. ................. 324/253

FOREIGN PATENT DOCUMENTS

JP         08-179023           7/1996
JP      2001099654 A  *  4/2001

OTHER PUBLICATIONS

English translation of the Detailed Description of JP 2001099654 A.*
Liakopoulos, T.M., et al., "A micro-fluxgate magnetic sensor using micromachined planar solenoid coils", Sensors & Actuators A, Elsevier Sequoia, S.,A. Lausanne, CH (Switzerland), vol. 77, No. 1, pp. 66-72, (Sep. 28, 1999).
Shim, Dong-Sik, et al., "Micro fluxgate sensor using solenoid driving and sensing coils", Optoelectronic and Microelectronic Materials and Devices, 2002, Piscataway, NJ, USA, IEEE, pp. 237-240, (Dec. 11, 2002).

* cited by examiner

*Primary Examiner*—Edward Lefkowitz
*Assistant Examiner*—David M. Schindler
(74) *Attorney, Agent, or Firm*—Lee & Morse, P.C.

(57) ABSTRACT

In a fluxgate sensor integrated in a semiconductor substrate and a method for manufacturing the same, the fluxgate sensor includes a soft magnetic core formed on the semiconductor substrate, an excitation coil winding the soft magnetic core and being insulated by first and second insulating layers deposited above and below the soft magnetic core, respectively, and a pick-up coil, winding the soft magnetic core and being insulated by third and fourth insulating layers deposited above and below the excitation coil, respectively.

38 Claims, 8 Drawing Sheets

FLUXGATE SENSOR INTEGRATED IN A SEMICONDUCTOR SUBSTRATE AND METHOD FOR MANUFACTURING THE SAME

BACKGROUND OF THE INVENTION

1. Field of the Invention

The present invention generally relates to a fluxgate sensor. More particularly, the present invention relates to a fluxgate sensor integrated in a semiconductor substrate and a method for manufacturing the same.

2. Description of the Related Art

The existence of magnetic energy has been proven through various physical phenomena. For example, a fluxgate sensor enables a human to indirectly perceive magnetic energy since magnetic energy is not perceivable by human sense organs, such as eyes or ears. Regarding a fluxgate sensor, a magnetic sensor employing a soft magnetic body and coil have been conventionally used. A magnetic sensor is made by winding a coil around a relatively large bar-shaped core or annular-shaped core, which is formed of a soft magnetic ribbon. In addition, an electronic circuit is employed to obtain a magnetic field in proportion to the measured magnetic field.

The conventional fluxgate sensor, however, has the following problems, some of which are due to the structure of the conventional fluxgate sensor. In the structure of a conventional fluxgate sensor, the coil being wound around a large bar-shaped core or annular-shaped core, which is made of soft magnetic ribbon, results in high production costs and a large overall size of the system. In addition, magnetic flux leakage by the core is inevitable in the flux change generated by an excitation coil. Accordingly, high sensitivity is not readily achieved.

SUMMARY OF THE INVENTION

In an effort to overcome at least some of the above-mentioned problems, it is a feature of an embodiment of the present invention to provide a high sensitivity fluxgate sensor integrated in a semiconductor substrate capable of not only reducing overall size of a system, but also detecting a magnetic field with greater accuracy, and a method for manufacturing the highly sensitive fluxgate sensor.

Another feature of an embodiment of the present invention is to prevent an induction wave in a flux change detecting coil when the external magnetic field is measured as zero (0).

In order to provide the above and other features of the present invention, A fluxgate sensor includes a soft magnetic core formed on a semiconductor substrate, an excitation coil winding the soft magnetic core and being insulated by first and second insulating layers deposited above and below the soft magnetic core, respectively, and a pick-up coil, winding the soft magnetic core and being insulated by third and fourth insulating layers deposited above and below the excitation coil, respectively.

The soft magnetic core may include two parallel bars each disposed on the same plane. In this configuration, the two parallel bars are aligned to have a length dimension in a direction of magnetic field detection. Alternately, the soft magnetic core may be formed in a rectangular-ring type. In this configuration, the rectangular ring is oriented to have a length dimension in a direction of magnetic field detection.

The excitation coil may have a structure of alternately winding the two parallel bars substantially in a figure-eight pattern. Alternatively, the excitation coil may have a structure of individually winding the two parallel bars substantially in a solenoid pattern. When rectangular-ring is used for the soft magnetic core, the excitation coil may either have a structure of alternately winding two opposite sides of the rectangular-ring aligned in the direction of magnetic field detection substantially in a figure-eight pattern or a structure of individually winding the two opposite sides.

The pick-up coil may be stacked on the excitation coil that has a structure of alternately winding the two parallel bars or two opposite sides of the rectangular ring aligned in the direction of magnetic field detection, together in figure-eight pattern, or a structure of winding the two parallel bars or the two longer sides of the rectangular-ring respectively in the solenoid pattern. In this case, the pick-up coil has a structure of winding the two parallel bars or the two longer sides of the rectangular ring together in the solenoid pattern. Alternatively, the pick-up coil may be stacked on the excitation coil that has a structure of winding the two parallel bars or two opposite sides of the rectangular ring aligned in the direction of magnetic field detection, together in figure-eight pattern, or a structure of winding the two bars or the two longer sides of the rectangular-ring respectively in the solenoid pattern. In this case, the pick-up coil has a structure of winding the two bars or the two longer sides of the rectangular ring respectively in the solenoid pattern.

According to another feature of an embodiment of the present invention, a method for manufacturing a fluxgate sensor includes forming a lower portion of a pick-up coil on an upper surface of a semiconductor substrate, depositing a first insulating layer on the upper surface of the semiconductor substrate, in which the lower portion of the pick-up coil is formed, and forming a lower portion of an excitation coil at a position corresponding to the pick-up coil, depositing a second insulating layer on an upper surface of the lower portion of the excitation coil, and forming a plurality of first via holes electrically connected with the lower portion of the excitation coil, forming a soft magnetic core on an upper portion of the second insulating layer having the first via holes formed therein, to correspond in arrangement with the pick-up coil and the excitation coil, depositing a third insulating layer on an upper portion of the soft magnetic core, and forming a plurality of second via holes electrically connected with the lower portion of the excitation coil, forming an upper portion of the excitation coil at a position corresponding to the lower portion of the excitation coil on an upper surface of the third insulating layer having the plurality of second via holes formed therein, the upper portion of the excitation coil being electrically connected with the lower portion of the excitation coil, depositing a fourth insulating layer on the upper portion of the excitation coil and forming a plurality of third via holes electrically connected with the lower portion of the pick-up coil, and forming an upper portion of the pick-up coil corresponding to the lower portion of the pick-up coil on the upper portion of the fourth insulating layer having the plurality of third via holes formed therein, the upper portion of the pick-up coil being electrically connected with the lower portion of the pick-up coil.

Forming the lower portion of the pick-up coil may include forming a plurality of trenches in the upper surface of the semiconductor substrate, the plurality of trenches having a high rate of section area and small pitch size, depositing by vacuum evaporation a seed layer on the upper surface of the semiconductor substrate having the plurality of trenches formed therein, plating the upper surface of the semiconductor substrate having the seed layer deposited thereon, and polishing the upper surface of the semiconductor substrate to insulate the metal filling each of the plurality of trenches from one another. Alternatively, forming the lower portion of the pick-up coil may include depositing a seed layer on the upper portion of the semiconductor substrate, applying a photosensitive material on an upper portion of the seed layer, and forming a plating flask through exposure and developing, plating through the plating flask, and removing the plating flask.

Each of forming the lower portion of the excitation coil, forming the upper portion of the excitation coil, and forming the upper portion of the pick-up coil may include applying the photosensitive material on an exposed upper surface of the previously applied insulating layer, forming a pattern by using an exposure with respect to the photosensitive material, forming a plating flask by etching the photosensitive material in accordance with the pattern, forming a seed layer on the upper surface of the semiconductor substrate in which the photosensitive material is etched in accordance with the pattern, plating the substrate in which the seed layer is formed, polishing the upper surface of the semiconductor substrate to insulate the metal filling the etched area, and removing the plating flask from the semiconductor substrate. Alternatively, each of forming the lower portion of the excitation coil, forming the upper portion of the excitation coil, and forming the upper portion of the pick-up coil may include depositing a seed layer on an exposed upper surface of the previously applied insulating layer, applying a thick photoresist on an upper portion of the seed layer, forming a pattern using an exposure with respect to the thick photoresist, forming a plating flask by etching along the pattern, plating through the plating flask, and polishing the upper surface of the semiconductor substrate to insulate the metal filling the etched area, and removing the plating flask and the seed layer at the lower portion of the plating flask from the semiconductor substrate.

With a fluxgate sensor integrated in a semiconductor substrate and a manufacturing method thereof according to the embodiments of the present invention, because a soft magnetic core is extended in a direction of magnetic field detection, a demagnetizing field property may be reduced. Further, because the pick-up coil is stacked on the excitation coil that winds the soft magnetic core, no induction waves occur in the pick-up coil. Additionally, the fluxgate sensor according to the embodiments of the present invention has a compact size, consumes little power, and may be easily integrated into various other circuits.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE PREFERRED EMBODIMENTS

Figure 1:
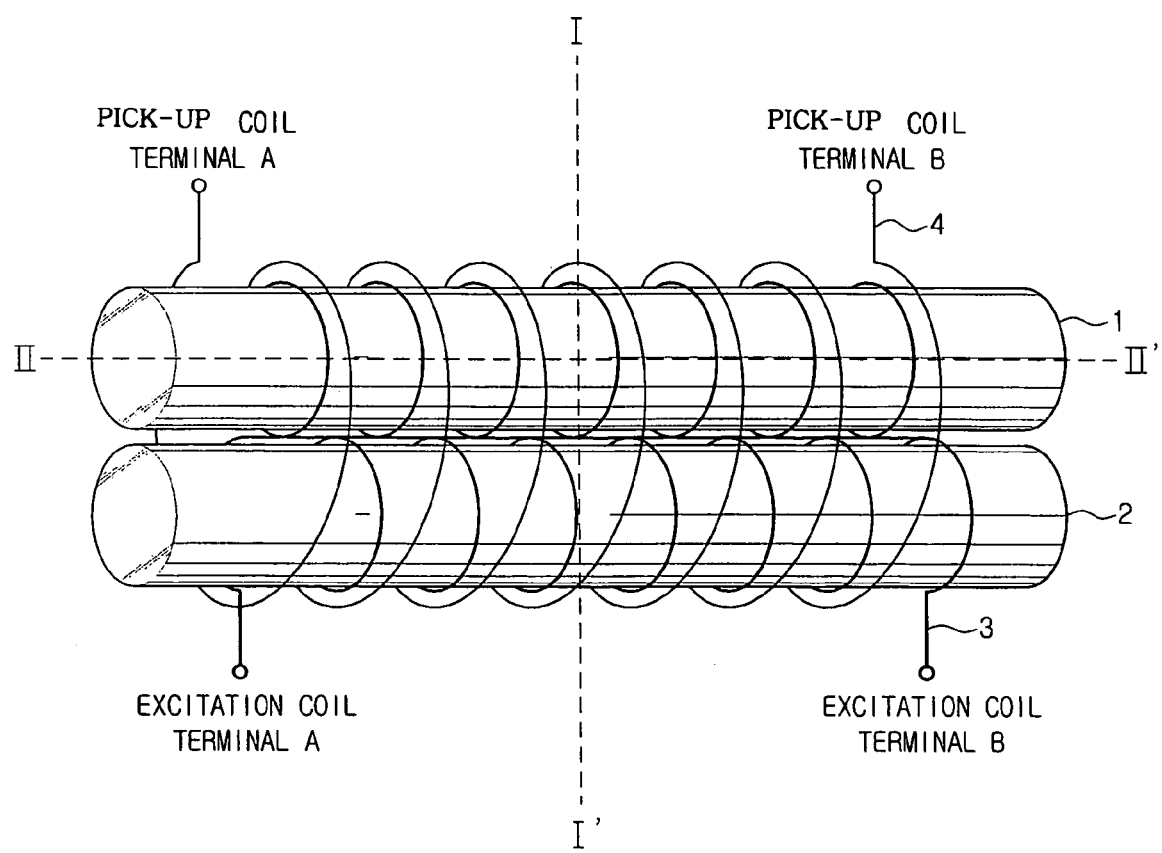
FIG. 1 illustrates a view of a fluxgate sensor according to a first preferred embodiment of the present invention.

Korean Application No. 2003-5078, filed Jan. 25, 2003, and entitled: "Fluxgate Sensor Integrated in a Semiconductor Substrate and Method for Manufacturing the Same," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like reference numerals refer to like elements throughout.

FIG. 1 illustrates a view of a fluxgate sensor integrated in a semiconductor substrate according to a first preferred embodiment of the present invention.

Figure 5:
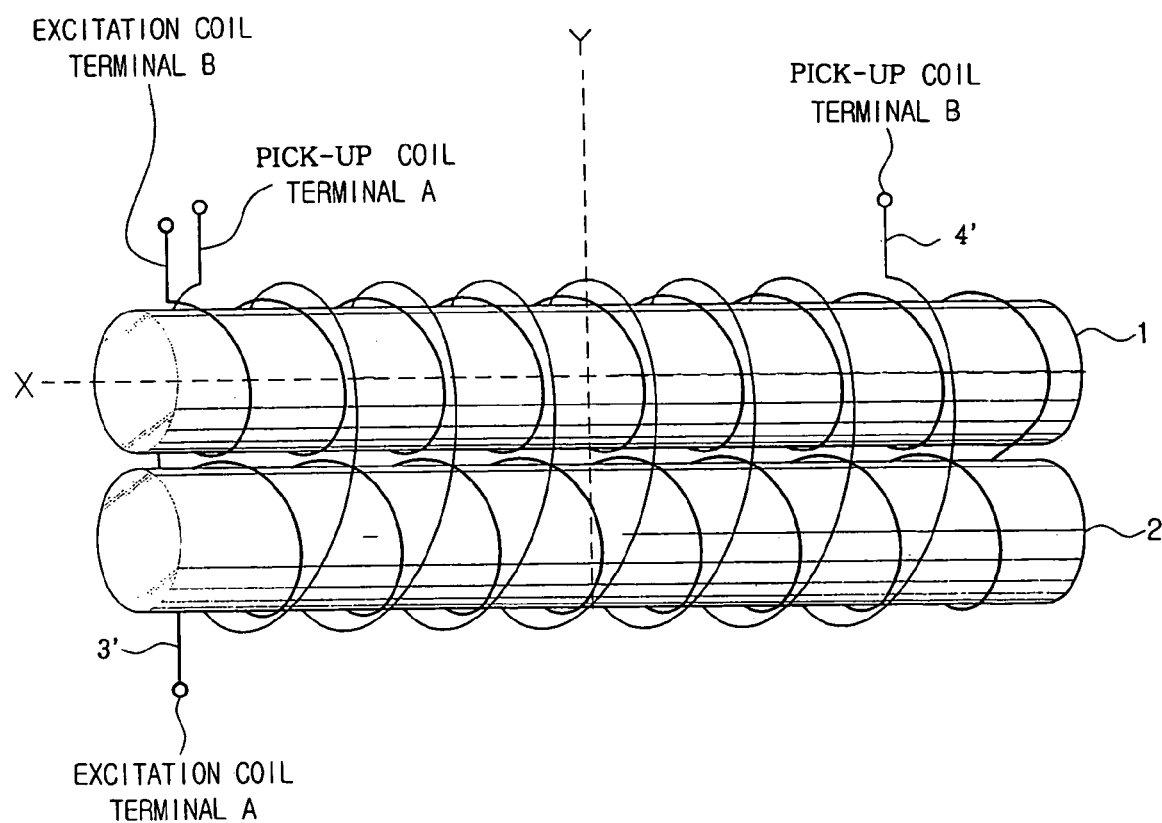
FIG. 5 illustrates a view of a fluxgate sensor integrated in a semiconductor substrate according to a second preferred embodiment of the present invention.

In the fluxgate sensor according to the first embodiment of the present invention, parallel first and second bar-type soft magnetic cores 1 and 2 are wound by an excitation coil 3 substantially in a figure-eight pattern. A pick-up coil 4 is formed on the excitation coil 3, winding the first and the second soft magnetic cores 1 and 2 together substantially in a solenoid pattern. Alternately, as shown in FIG. 5, the excitation coil 3 may be individually wound around the first and second bar-type soft magnetic cores 1 and 2. In addition, the pick-up coil 4 may have a structure formed on the excitation coil 3 and individually winding the first and second bar-type soft magnetic cores 1 and 2.

For convenience in explanation, a configuration in which the first and second soft magnetic cores are wound in a figure-eight pattern is called a 'united structure.' A configuration in which the first and second soft magnetic cores are individually wound is called a 'separated structure.' In a case of the soft magnetic core being a rectangular-ring type, which will be subsequently described in connection with the second preferred embodiment, a configuration in which the two longer sides of the rectangular-ring type soft magnetic core aligned in a direction of magnetic field detection are wound in a figure-eight pattern is called a 'united structure,' and a configuration in which the two longer sides are individually wound is called a 'separated structure.'

Figure 2A:
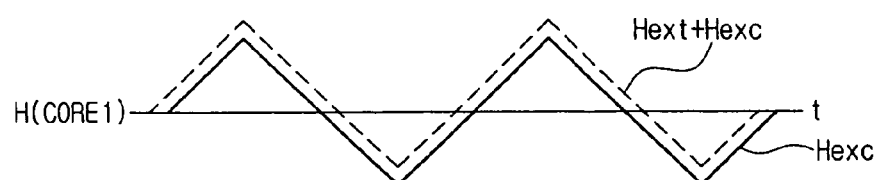
FIGS. 2A through 2F are waveforms for illustrating an operation of the fluxgate sensor of FIG. 1.
Figure 2B:
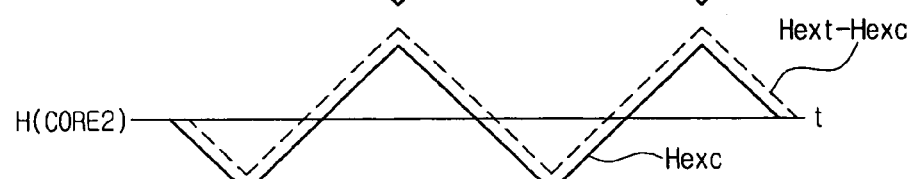
Figure 2C:
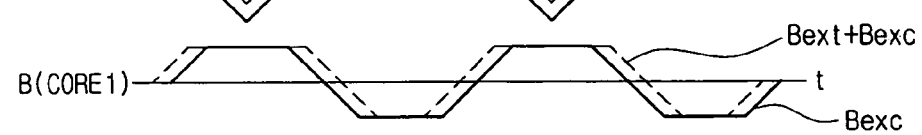
Figure 2D:
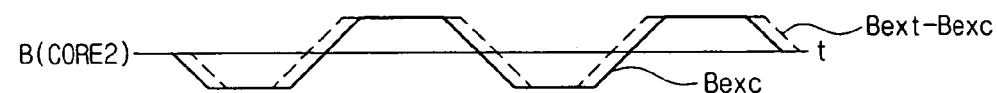
Figure 2E:
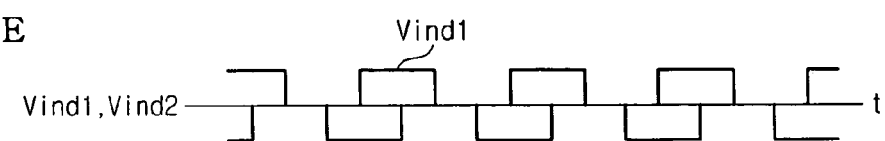
Figure 2F:
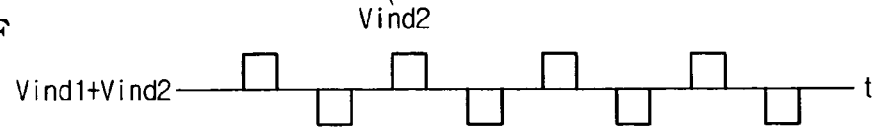

FIGS. 2A through 2F are waveforms (or timing views) for explaining an operation of the fluxgate sensor of FIG. 1. FIG. 2A is a waveform of a magnetic field H(CORE1) generated from the first soft magnetic core 1. FIG. 2B is a waveform of a magnetic field H(CORE2) generated from the second soft magnetic core 2. FIG. 2C is a waveform of a flux density B(CORE1) generated from the first soft magnetic core 1. FIG. 2D is a waveform of a flux density B(CORE2) generated from the second soft magnetic core 2. FIGS. 2E and 2F are waveforms of the first and second induction voltages Vind1 and Vind2, and the sum (Vind1+Vind2) of the first and second induction voltages, respectively.

With the excitation coil 3 wound around the first and second bar-type soft magnetic cores 1 and 2 in the united structure, such as the figure-eight pattern, or in the separated structure, and with the supply of AC excitation current, an internal magnetic field (Hext+Hexc) and a flux density (Bext+Bexc) at the first bar-type soft magnetic core 1, and an internal magnetic field (Hext-Hexc) and a flux density (Bext-Bexc) at the second bar-type soft magnetic core 2 act in opposite directions, as may be seen in FIGS. 2A, 2B, 2C, and 2D. Here, Hext is the external magnetic field, Hexc is the magnetic field caused by the excitation coil 3, Bext is the flux density caused by the external magnetic field, and Bexc is the flux density caused by the excitation coil 3.

The pick-up coil 4 is wound to obtain the sum of variation of the magnetic flux in each of the cores 1 and 2, and to detect the flux variation by the electronic induction caused by the AC excitation current. Since the induction voltage at the pick-up coil 4 has internal magnetic fields acting in opposite directions, the induction voltage detected at the pick-up coil 4 is a result of offsetting the two symmetrically generated induction voltages Vind1 and Vind2, as may be seen in FIG. 2F. More specifically, because the external magnetic field Hext acts in a same direction with respect to the first and second bar-type soft magnetic cores 1 and 2, the internal magnetic fields generated from the first and second cores 1 and 2 are Hext+Hexc and Hext-Hexc. As shown in FIG. 2E, the voltages Vind1 and Vind2 are induced at the pick-up coil 4, respectively. Thus, as shown in FIG. 2F, the two induction voltages are mutually offset, and by detecting the sum of the induction voltages Vind1 and Vind2, the magnitude of the external magnetic field Hext may be obtained.

In the fluxgate sensor constructed as described above, it is important to have an appropriate structure of two soft magnetic cores 1 and 2, the excitation coil 3 having the united structure winding the two soft magnetic cores 1 and 2 in a figure-eight pattern, and the pick-up coil 4 winding over the excitation coil 3 in a solenoid pattern. This is important because, in the absence of the external magnetic field Hext, such structure offsets the induction waves of the magnetic fields generated by the first and second bar-type soft magnetic cores 1 and 2, and the flux generated by the excitation coil 3 forms a closed magnetic path in the soft magnetic cores.

The soft magnetic core of FIG. 1 may take a form of a rectangular ring. In this configuration, the same benefit as achieved in the bar-type soft magnetic cores may be obtained by the structure in which the excitation coil 3 is wound around the two longer sides of the rectangular-ring type soft magnetic core, and the pick-up coil 4 is wound around the two longer sides in a solenoid pattern.

The detection of a magnetic field is also possible by a structure of a single bar-type core being arranged with the excitation coil and the pick-up coil. This configuration, however, requires more complicated signal processing of the output from the detecting coil, such as amplification and filtering, because there are induction voltage waves generated at the detection coil by the excitation coil even in the absence of the external magnetic field. Accordingly, using either the two bar-type cores or a single rectangular-ring type core will allow more advantages, especially in terms of signal processing requirements.

FIGS. 3A through 3E illustrate sectional views taken on lines I–I' and II–II' of the fluxgate sensor of FIG. 1, for explaining stages in the process of producing the fluxgate sensor on the semiconductor substrate. More specifically, a left side of FIGS. 3A through 3E represent the sectional views taken on line I–I' and a right side represents the sectional views taken on line II–II'.

The process of producing the fluxgate sensor will be described below.

Figure 3A:
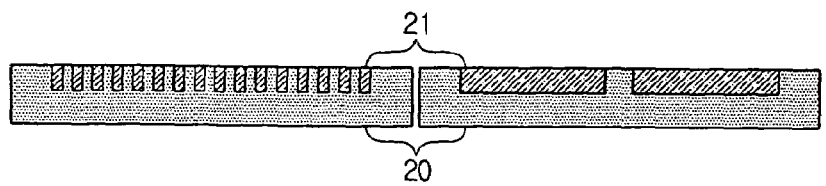
FIGS. 3A through 3E illustrate sectional views taken along lines I–I' and II–II' of FIG. 1, showing stages in a process of forming the fluxgate sensor of FIG. 1 on a semiconductor substrate.

Referring to FIG. 3A, by first using a photosensitive material and an exposure on an upper surface of a semiconductor substrate 20, a lower pattern is formed for a pick-up coil. Then, through an etching process, a plurality of high-section-rate trenches is formed along the pattern. Preferably, the trenches have a high rate of section area and small pitch size. Next, an oxide film (not shown) is formed over the etched section of the semiconductor substrate 20 for providing electric insulation. Then, to perform a metal-plating over the oxide film, a seed layer (not shown) is evaporated, and the metal layer, such as a copper layer, is formed, filling the recessed parts of the high-section-rate trenches, which are recessed by the etching of the upper portion of the seed layer. Subsequently, the upper surface of the substrate 20 undergoes a chemical mechanical polishing (CMP) so that the metal filling each of the recessed parts of the trenches are insulated from one another.

Alternately, the lower portion of the pick-up coil winding formed on the substrate 20 may be formed by other methods. A first example of another method will now be described. First, an oxide film is deposited on the semiconductor substrate 20 for insulation, and a seed layer for metal plating is formed on the oxide film. Next, after a thick photoresist is applied on an upper portion of the seed layer, a pattern is formed by exposure. By etching along the pattern, a shape for the lower portion of the pick-up coil is obtained. Subsequently, by plating the etched area and removing the thick photoresist and the seed layer, the lower portion of the pick-up coil winding is formed. FIG. 3A illustrates a sectional view of the lower portion 21 of the pick-up coil being formed on the semiconductor substrate 20.

Figure 3B:
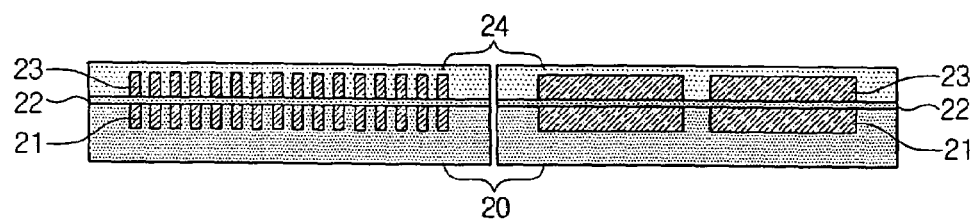

Referring to FIG. 3B, a first insulating layer 22 is deposited on the upper surface of the substrate 20, which includes the lower portion 21 of the pick-up coil. Then, a lower portion 23 of the excitation coil is formed on the first insulating layer 22. The lower portion 23 of the excitation coil is formed as follows: on the insulating layer 22 on the substrate 20 having the lower portion 21 of the pick-up coil, a photosensitive material is applied, and a pattern corresponding to the lower portion 23 of the excitation coil is formed through the exposure. A plating flask is formed by etching the photosensitive material along the pattern. Then, the substrate with a seed layer (not shown) deposited thereon is plated. Then, in order for the metal in the etched area to be insulated, a chemical mechanical polishing (CMP) is performed. Next, by removing the plating flask from the substrate, the lower portion 23 of the excitation coil is formed. In an alternate method of forming the lower pattern for the excitation coil, a seed layer is evaporated on an upper portion of the insulating layer and a thick photoresist is applied onto the seed layer, and the lower pattern for the excitation coil is formed by exposure. Then, a plating flask is formed by etching along the pattern. Subsequently, in order for the metal in the etched area to be insulated, chemical mechanical polishing (CMP) is performed. By removing the plating flask and the seed layer below the plating flask, the lower portion 23 of the excitation coil is formed. FIG. 3B illustrates a sectional view of the lower portion 23 of the excitation coil formed on the semiconductor substrate 20. In FIG. 3B, a second insulating layer 24 is deposited on an upper surface of the lower portion 23 of the excitation coil.

Figure 3C:
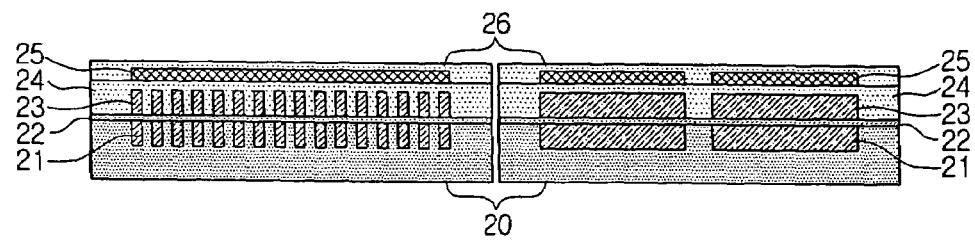

Referring to FIG. 3C, in order to electrically connect the lower portion 23 of the excitation coil to an upper portion of the excitation coil, first via holes (not shown) are formed, and a soft magnetic core 25 is formed on the second insulating layer 24, which is deposited on the lower portion 23 of the excitation coil. In order to form the soft magnetic core 25, first, a soft magnetic film is deposited on the second insulating layer 24 on the lower portion 23 of the excitation coil, and then the soft magnetic film is patterned and etched. FIG. 3C illustrates a sectional view of the soft magnetic core 25 formed on the semiconductor substrate 20, showing a third insulating layer 26 being deposited on the soft magnetic core 25.

Figure 3D:
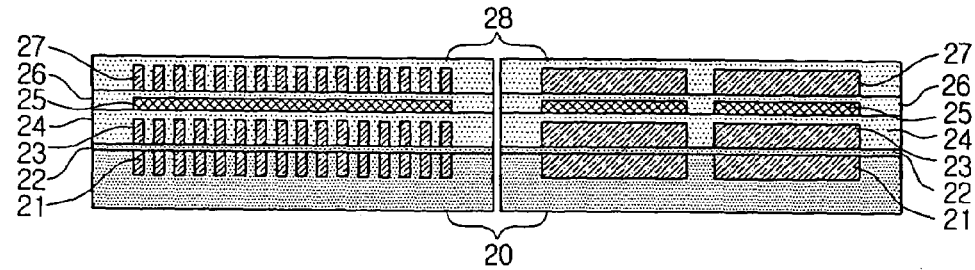

Referring to FIG. 3D, second via holes are then formed in the third insulating layer 26 in locations aligned with the previously-formed first via holes, and an upper portion 27 of the excitation coil is formed on the third insulating layer 26, on which the second via holes are formed. Since forming the upper portion 27 of the excitation coil is identical with a process of forming the lower portion 23 of the excitation coil, a description thereof will not be repeated. The lower portion 23 of the excitation coil is electrically connected with the upper portion 27 of the excitation coil through the second via holes. FIG. 3D illustrates a sectional view of the upper portion 27 of the excitation coil formed by the above-described process. A fourth insulating layer 28 is deposited on the upper portion 27 of the excitation coil.

Figure 3E:
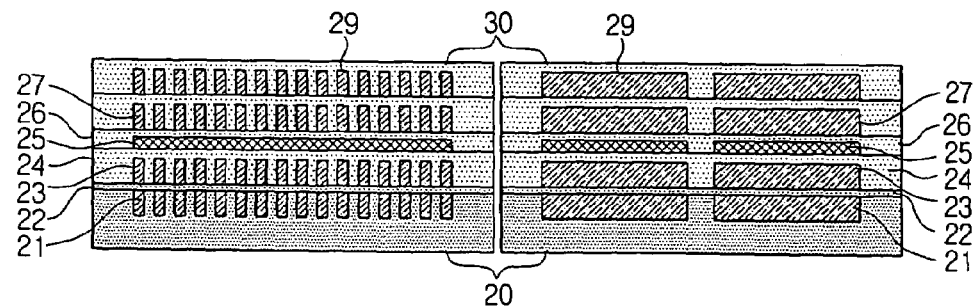

Referring to FIG. 3E, third via holes (not shown) are formed in the fourth insulating layer 28 to electrically connect the lower portion 21 of the pick-up coil to an upper portion 29 of the pick-up coil. The upper portion 29 of the pick-up coil is then formed on the fourth insulating layer 28 having the third via holes. Since forming the upper portion 29 of the pick-up coil is identical with the process of forming the lower portion 23 of the excitation coil that was described above, the description thereof will not be repeated. The upper portion 29 of the pick-up coil is electrically connected with the lower portion 21 of the pick-up coil by the third via holes. FIG. 3E illustrates a sectional view of the pick-up coil formed on the semiconductor substrate 20, including the upper portion 29 of the pick-up coil. In FIG. 3E, a fifth insulating layer 30 is stacked on the pick-up coil.

Figure 4A:
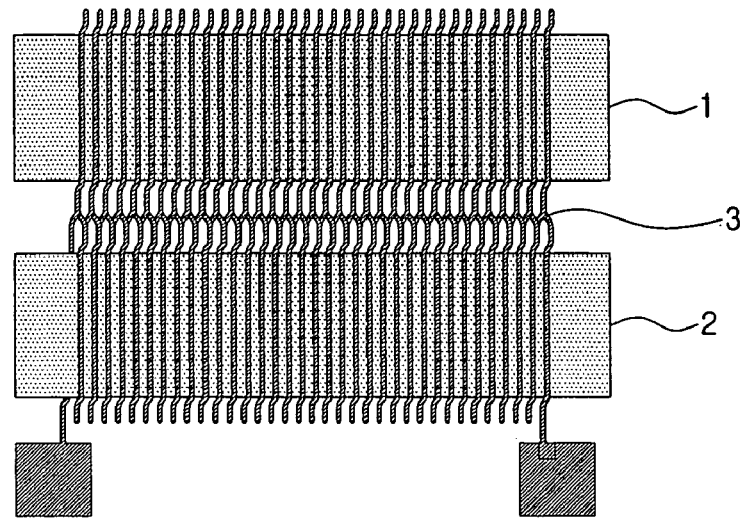
FIG. 4A illustrates a plan view of two parallel bar-type soft magnetic cores arranged in a same plane, and an excitation coil of a united structure winding the two bar-type soft magnetic cores substantially in a figure-eight pattern.
Figure 4B:
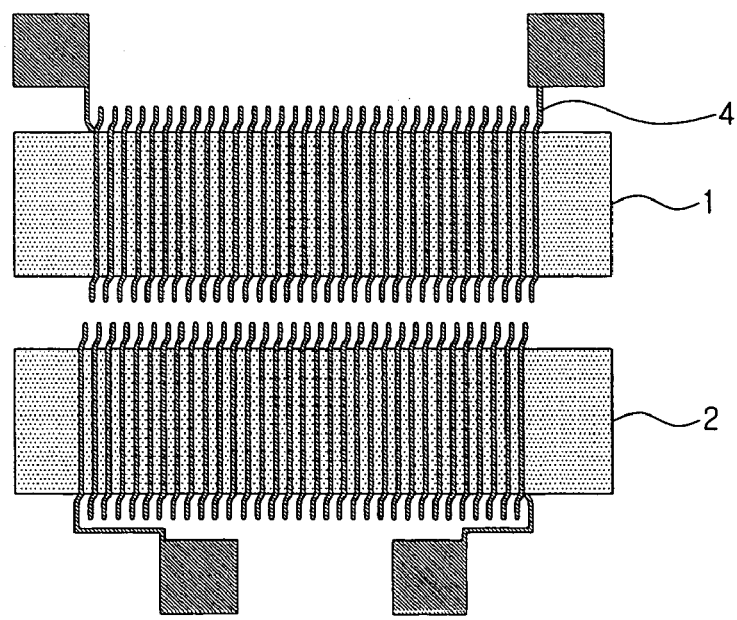
FIG. 4B illustrates a plan view of a pick-up coil of a separated structure winding the two bar-type soft magnetic cores, respectively.
Figure 4C:
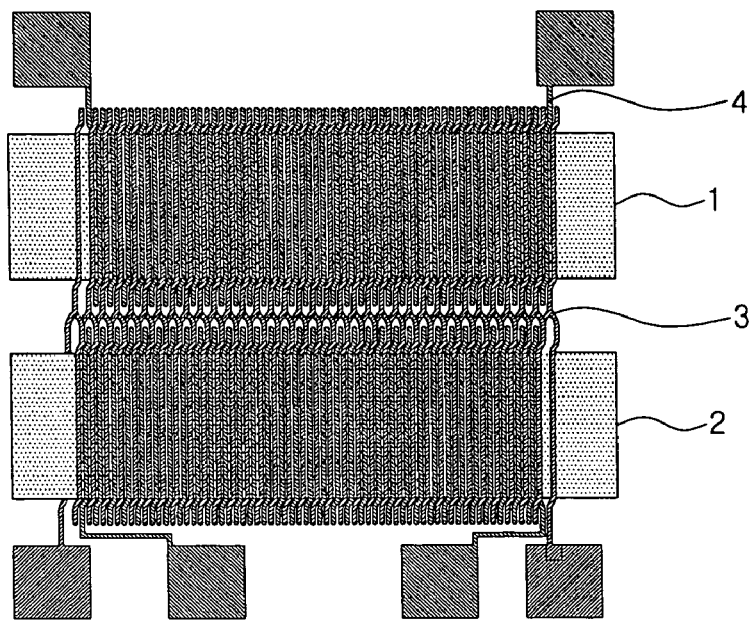
FIG. 4C illustrates a plan view of two bar-type soft magnetic cores placed on a same plane, and the excitation coil of FIG. 4A and the pick-up coil of FIG. 4B formed on the two bar-type soft magnetic cores together.

FIGS. 4A through 4C illustrate plan views of the fluxgate sensor formed on the semiconductor substrate according to the first preferred embodiment of the present invention. More specifically, FIG. 4A illustrates a plan view of two parallel bar-type soft magnetic cores 1 and 2 formed on a same plane, with the excitation coil 3 having the united structure formed thereon. FIG. 4B illustrates a plan view of two parallel bar-type soft magnetic cores 1 and 2 with a pick-up coil 4 having the separated structure formed thereon. FIG. 4C illustrates a plan view of two parallel bar-type soft magnetic cores 1 and 2 placed in the same plane, with the excitation coil 3 and the pick-up coil 4 of FIGS. 4A and 4B formed thereon.

Figure 4D:
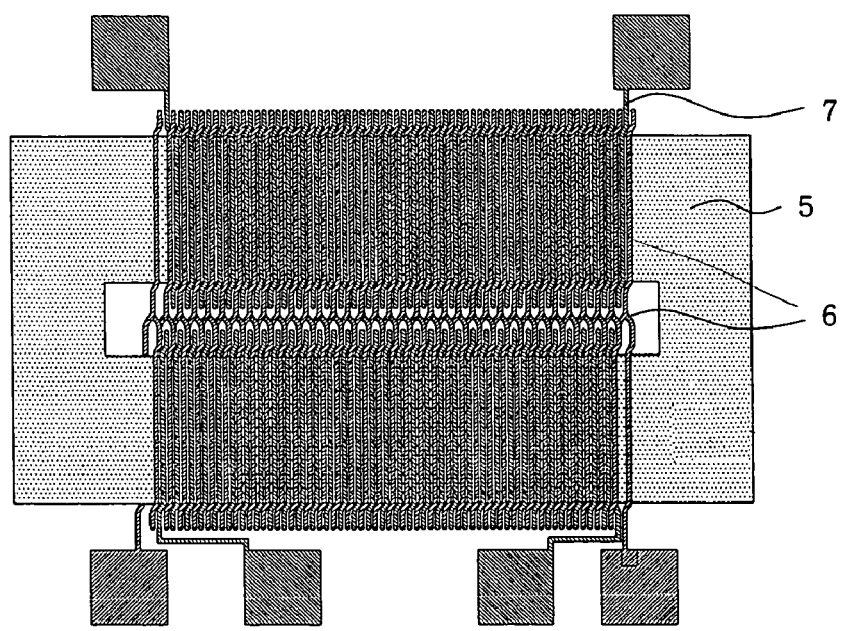
FIG. 4D illustrates a plan view of a rectangular-ring type soft magnetic core placed in a same plane of a semiconductor substrate, with an excitation coil of the united structure formed on two longer sides of the rectangular-type soft magnetic core, and a pick-up coil individually winding the two longer sides of the rectangular-type soft magnetic core.

FIG. 4D illustrates a plan view of a rectangular-ring type soft magnetic core 5 in a same plane, with an excitation coil 6 having the united structure winding two longer sides of the rectangular-ring type core, and a pick-up coil 7 having the separated structure individually winding the two longer sides of the rectangular-ring type soft magnetic core.

FIG. 5 illustrates a view of the fluxgate sensor integrated in a semiconductor substrate according to a second preferred embodiment of the present invention. In the fluxgate sensor of the second preferred embodiment, an excitation coil 3' individually winds the first and second bar-type soft magnetic cores 1 and 2, and a pick-up coil 4' winds over the excitation coil 3', around the first and second bar-type soft magnetic cores 1 and 2 together.

Alternatively, in the second preferred embodiment of the present invention, the first and second bar-type soft magnetic cores 1 and 2 shown in FIG. 5 may take the form of a rectangular-ring. In this configuration, the excitation coil separately winds the two longer sides of the rectangular-ring type soft magnetic core in the direction of magnetic field detection, and the pick-up coil winds around the two longer sides in a solenoid pattern, to thereby offset the induction voltage. Here, the pick-up coil can be wound around the two longer sides of the rectangular-ring type soft magnetic core in a solenoid pattern.

As described above, the induction voltage detected at the pick-up coil according to the second preferred embodiment is similar to the induction voltage detected in the first preferred embodiment of the present invention. In addition, the induction voltage detected from the two sides are offset in the absence of an external magnetic field, which is also similar to the first embodiment.

Figure 6A:
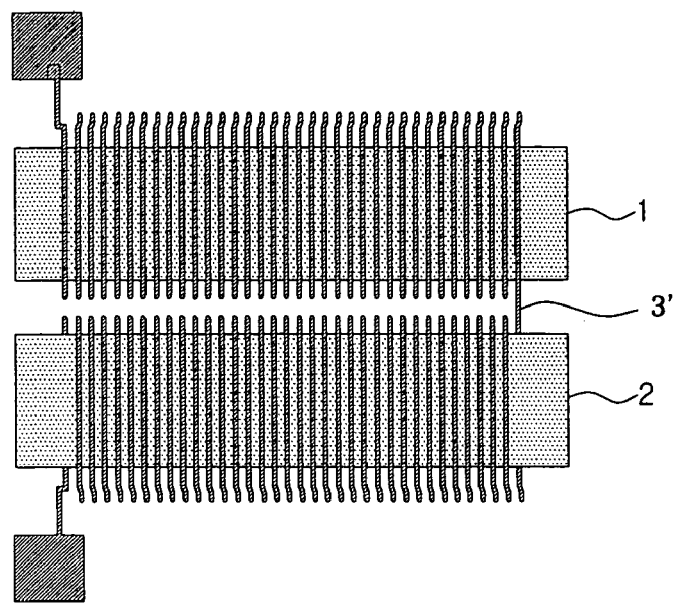
FIG. 6A illustrates a plan view of two parallel bar-type soft magnetic cores formed in a same plane, with an excitation coil of the separated structure individually winding the two parallel bar-type soft magnetic cores.
Figure 6B:
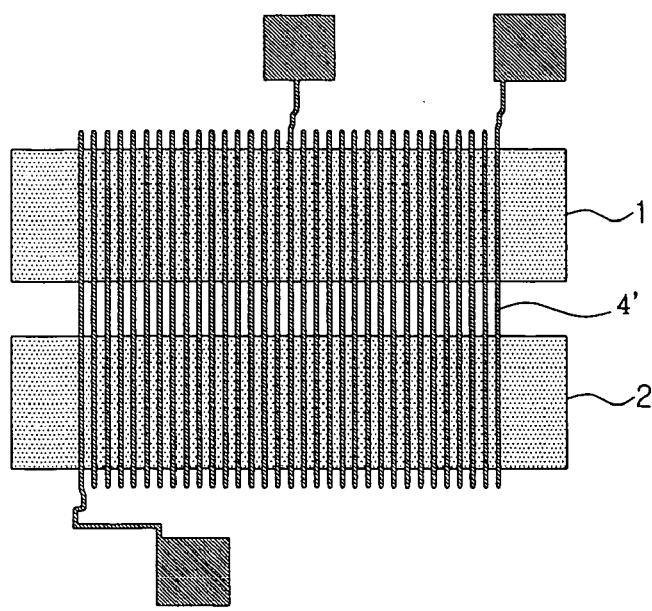
FIG. 6B illustrates a plan view of two parallel bar-type soft magnetic cores placed in a same plane, with a pick-up coil of the united structure winding the two bar-type soft magnetic cores.
Figure 6C:
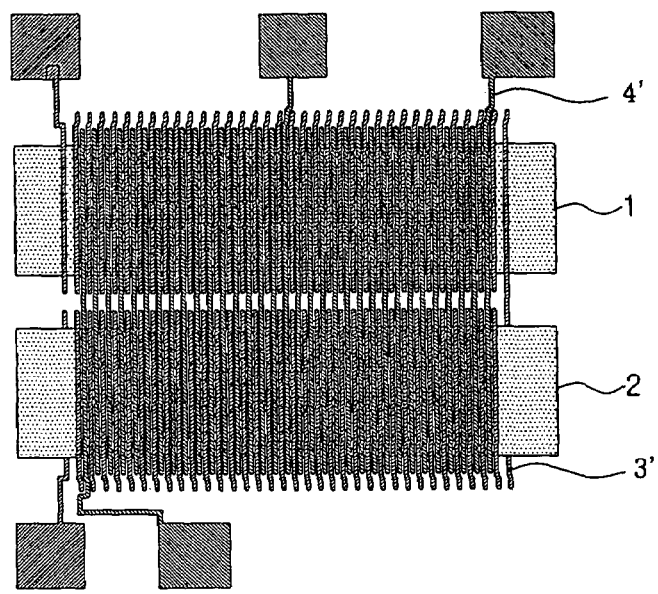
FIG. 6C illustrates a plan view of two bar-type soft magnetic cores placed in the same plane, with the excitation coil and the pick-up coil of FIGS. 6A and 6B formed on the two bar-type soft magnetic cores together.

FIGS. 6A through 6D illustrate plan views of the fluxgate sensor formed on the semiconductor substrate according to the second preferred embodiment of the present invention. More specifically, FIG. 6A illustrates a plan view of the excitation coil 3' having the separated structure winding, in a solenoid pattern, the parallel first and second bar-type soft magnetic cores 1 and 2, which are placed in a same plane. FIG. 6B illustrates a plan view of the pick-up coil 4' having the united structure winding the parallel first and second bar-type soft magnetic cores 1 and 2, which are placed in the same plane together. FIG. 6C illustrates a plan view of the excitation coil 3' and the pick-up coil 4' winding the first and second bar-type soft magnetic cores 1 and 2 in the same plane.

Figure 6D:
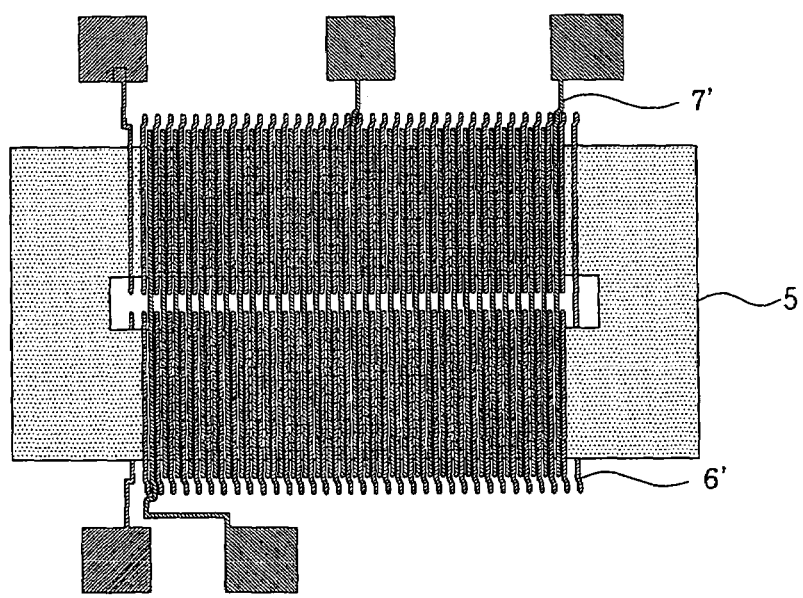
FIG. 6D illustrates a plan view of a rectangular-ring type soft magnetic core placed in a same plane of the semiconductor substrate, with an excitation coil of the separated structure respectively winding two longer sides of the rectangular-ring type soft magnetic core, and a pick-up coil of the united structure winding the two longer sides of the rectangular-ring type soft magnetic core together.

FIG. 6D illustrates a plan view of a rectangular-ring type soft magnetic core 5 placed in the same plane of the semiconductor substrate, with an excitation coil 6' having a separated structure winding two longer sides of the rectangular-ring type soft magnetic core, and a pick-up coil 7' having a united structure winding the two longer sides of the rectangular-ring type soft magnetic core together.

With a fluxgate sensor according to an embodiment of the present invention, because the soft magnetic cores construct a closed magnetic path, leakage of magnetic flux may be minimized. In addition, because the excitation coil is differentially operated, the sum of driving signals may be offset, and therefore, signal processing becomes easier. Furthermore, by the construction in which the excitation coil and the pick-up coil are wound in the closed magnetic path through the use of micro-machining technology, high sensitivity is obtained.

Because the fluxgate sensor integrated in the semiconductor substrate according to the embodiments of the present invention may be integrated with other sensors and circuits, the overall size of the system may be greatly reduced. Further, although being compact-sized, the fluxgate sensor according to the embodiments of the present invention detects even weak external magnetic fields with high sensitivity by differentially driving the voltage induced at the respective cores or sides of the cores due to the external magnetic fields. Since the system is produced using semiconductor integrating technology, power consumption may be greatly reduced. In addition, a fluxgate sensor according to the embodiments of the present invention may be produced at a lower cost than conventional bar-type or annular-shaped cores. Further, the fluxgate sensor according to the embodiments of the present invention facilitates mass-production.

A fluxgate sensor according to the embodiments of the present invention may be used in various applications. For example, but not by way of limitation, such a device may be used in a navigation system using terrestrial magnetism detection, an earth magnetism change monitor (earthquake prediction), a biological electric measurement device, or an apparatus for detecting defects in metals. As for indirect applications, the fluxgate sensor may also be used, for example, but not by way of limitation, in a magnetic encoder, a contactless potentiometer, an electric current sensor, a torque sensor, and a displacement sensor.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A fluxgate sensor, comprising:
    a soft magnetic core formed on a semiconductor substrate;
    an excitation coil, winding the soft magnetic core and being insulated by first and second insulating layers deposited above and below the soft magnetic core, respectively;
    a pick-up coil, winding the soft magnetic core and being insulated by third and fourth insulating layers deposited above and below the excitation coil, respectively; and
    along a direction substantially perpendicular to the semiconductor substrate, overlapping portions of the pick-up coil overlapping with and sandwiching overlapping portions of the excitation coil and a portion of the soft magnetic core extending substantially parallel to the semiconductor substrate between the overlapping portions of the excitation coil and the pick-up coil.

2. The fluxgate sensor as claimed in claim 1, wherein the soft magnetic core comprises two parallel bars each disposed on a same plane that is substantially parallel to the semiconductor substrate.

3. The fluxgate sensor as claimed in claim 2, wherein the two parallel bars are aligned to have a length dimension in a direction of magnetic field detection.

4. The fluxgate sensor as claimed in claim 3, wherein the excitation coil has a structure of alternately winding the two parallel bars substantially in a figure-eight pattern.

5. The fluxgate sensor as claimed in claim 4, wherein the pick-up coil has a structure of winding the two parallel bars together substantially in a solenoid pattern.

6. The fluxgate sensor as claimed in claim 4, wherein the pick-up coil has a structure of individually winding the two parallel bars substantially in a solenoid pattern.

7. The fluxgate sensor as claimed in claim 3, wherein the excitation coil has a structure of individually winding the two parallel bars substantially in a solenoid pattern.

8. The fluxgate sensor as claimed in claim 7, wherein the pick-up coil has a structure of winding the two parallel bars together substantially in a solenoid pattern.

9. The fluxgate sensor as claimed in claim 7, wherein the pick-up coil has a structure of individually winding the two parallel bars substantially in a solenoid pattern.

10. The fluxgate sensor as claimed in claim 1, wherein the soft magnetic core is formed in a rectangular-ring type.

11. The fluxgate sensor as claimed in claim 10, wherein the rectangular ring is oriented to have a length dimension in a direction of magnetic field detection.

12. The fluxgate sensor as claimed in claim 11, wherein the excitation coil has a structure of alternately winding two opposite sides of the rectangular ring aligned in the direction of magnetic field detection substantially in a figure-eight pattern.

13. The fluxgate sensor as claimed in claim 12, wherein the pick-up coil has a structure of winding two opposite sides of the rectangular ring aligned in the direction of magnetic field detection together substantially in a solenoid pattern.

14. The fluxgate sensor as claimed in claim 12, wherein the pick-up coil has a structure of individually winding two opposite sides of the rectangular ring aligned in the direction of magnetic field detection substantially in a solenoid pattern.

15. The fluxgate sensor as claimed in claim 11, wherein the excitation coil has a structure of individually winding two opposite sides of the rectangular ring aligned in the direction of magnetic field detection substantially in a solenoid pattern.

16. The fluxgate sensor as claimed in claim 15, wherein the pick-up coil is deposited on the excitation coil, and has a structure of winding two opposite sides of the rectangular ring aligned in the direction of magnetic field detection together substantially in a solenoid pattern.

17. The fluxgate sensor as claimed in claim 15, wherein the pick-up coil is deposited on the excitation coil, and has a structure of individually winding two opposite sides of the rectangular ring aligned in the direction of magnetic field detection substantially in a solenoid pattern.

18. A method for manufacturing a fluxgate sensor, comprising:
    forming a lower portion of a pick-up coil on an upper surface of a semiconductor substrate;

depositing a first insulating layer on the upper surface of the semiconductor substrate, in which the lower portion of the pick-up coil is formed, and forming a lower portion of an excitation coil at a position corresponding to the pick-up coil;

depositing a second insulating layer on an upper surface of the lower portion of the excitation coil, and forming a plurality of first via holes electrically connected with the lower portion of the excitation coil;

forming a soft magnetic core on an upper portion of the second insulating layer having the first via holes formed therein, to correspond in arrangement with the pick-up coil and the excitation coil;

depositing a third insulating layer on an upper portion of the soft magnetic core, and forming a plurality of second via holes electrically connected with the lower portion of the excitation coil;

forming an upper portion of the excitation coil at a position corresponding to the lower portion of the excitation coil on an upper surface of the third insulating layer having the plurality of second via holes formed therein, the upper portion of the excitation coil being electrically connected with the lower portion of the excitation coil;

depositing a fourth insulating layer on the upper portion of the excitation coil and forming a plurality of third via holes electrically connected with the lower portion of the pick-up coil; and forming an upper portion of the pick-up coil corresponding to the lower portion of the pick-up coil on the upper portion of the fourth insulating layer having the plurality of third via holes formed therein, the upper portion of the pick-up coil being electrically connected with the lower portion of the pick-up coil.

19. The method as claimed in claim 18, wherein forming the lower portion of the pick-up coil comprises:

forming a plurality of trenches in the upper surface of the semiconductor substrate, the plurality of trenches having a high rate of section area and small pitch size;

depositing by vacuum evaporation a seed layer on the upper surface of the semiconductor substrate having the plurality of trenches formed therein;

metal plating the upper surface of the semiconductor substrate having the seed layer deposited thereon; and polishing the upper surface of the semiconductor substrate to insulate the metal filling each of the plurality of trenches from one another.

20. The method as claimed in claim 18, wherein forming the lower portion of the pick-up coil comprises:

depositing a seed layer on the upper surface of the semiconductor substrate;

applying a photosensitive material on an upper portion of the seed layer, and forming a plating flask through exposure and developing;

plating through the plating flask; and removing the plating flask.

21. The method as claimed in claim 18, wherein each of forming the lower portion of the excitation coil, forming the upper portion of the excitation coil, and forming the upper portion of the pick-up coil comprises:

applying a photosensitive material on an exposed upper surface of the previously applied insulating layer;

forming a pattern using an exposure with respect to the photosensitive material;

forming a plating flask by etching the photosensitive material in accordance with the pattern;

forming a seed layer on the upper surface of the semiconductor substrate in which the photosensitive material is etched in accordance with the pattern;

metal plating the substrate in which the seed layer is formed;

polishing the upper surface of the semiconductor substrate to insulate the metal filling the etched area; and removing the plating flask from the semiconductor substrate.

22. The method as claimed in claim 18, wherein each of forming the lower portion of the excitation coil, forming the upper portion of the excitation coil and forming the upper portion of the pick-up coil comprises:

depositing a seed layer on an exposed upper surface of the previously applied insulating layer;

applying a thick photoresist on an upper portion of the seed layer;

forming a pattern using an exposure with respect to the thick photoresist;

forming a plating flask by etching along the pattern;

metal plating through the plating flask; and polishing the upper surface of the semiconductor substrate to insulate the metal filling the etched area; and removing the plating flask and the seed layer at a lower portion of the plating flask from the semiconductor substrate.

23. The method as claimed in claim 18, wherein the soft magnetic core comprises two parallel bars disposed in a same plane.

24. The method as claimed in claim 23, wherein the two parallel bars have are aligned to have a length dimension in a direction of magnetic field detection.

25. The method as claimed in claim 24, wherein the excitation coil has a structure of alternately winding the two parallel bars substantially in a figure-eight pattern.

26. The method as claimed in claim 25, wherein the pick-up coil is formed on the excitation coil and has a structure of winding the two parallel bars together substantially in a solenoid pattern.

27. The method as claimed in claim 25, wherein the pick-up coil is formed on the excitation coil and has a structure of individually winding the two parallel bars substantially in a solenoid pattern.

28. The method as claimed in claim 24, wherein the excitation coil has a structure of individually winding the two parallel bars substantially in a solenoid pattern.

29. The method as claimed in claim 28, wherein the pick-up coil is formed on the excitation coil and has a structure of winding the two parallel bars together substantially in a solenoid pattern.

30. The method as claimed in claim 28, wherein the pick-up coil is formed on the excitation coil and has a structure of individually winding the two parallel bars substantially in a solenoid pattern.

31. The method as claimed in claim 18, wherein the soft magnetic core is formed in a rectangular-ring type.

32. The method as claimed in claim 31, wherein the rectangular ring is oriented to have a length dimension in a direction of magnetic field detection.

33. The method as claimed in claim 32, wherein the excitation coil has a structure of alternately winding two opposite sides of the rectangular-ring substantially in a figure-eight pattern.

34. The method as claimed in claim 33, wherein the pick-up coil has a structure of winding two opposite sides together substantially in a solenoid pattern.

35. The method as claimed in claim 33, wherein the pick-up coil is formed on the excitation coil and has a structure of individually winding two opposite sides substantially in a solenoid pattern.

36. The method as claimed in claim 32, wherein the excitation coil has a structure of individually winding two opposite sides substantially in a solenoid pattern.

37. The method as claimed in claim 36, wherein the pick-up coil is formed on the excitation coil and has a structure of winding two opposite sides together substantially in a solenoid pattern.

38. The method as claimed in claim 36, wherein the pick-up coil is formed on the excitation coil and has a structure of individually winding two opposite sides substantially in a solenoid pattern.

* * * * *